(12) United States Patent
Su

(10) Patent No.: US 7,201,651 B2
(45) Date of Patent: Apr. 10, 2007

(54) LOUVER HEAT VENT FOR CHASSIS OF COMPUTER

(76) Inventor: Chi-Min Su, No. 9, Alley 13, Lane 541, Sec. 2, Yuan Jyi Rd., Sheh Tour Hsiang, Changhua Hsien (TW)

( * ) Notice: Subject to any disclaimer, the term of this patent is extended or adjusted under 35 U.S.C. 154(b) by 108 days.

(21) Appl. No.: 11/017,907

(22) Filed: Dec. 22, 2004

(65) Prior Publication Data

US 2006/0148399 A1    Jul. 6, 2006

(51) Int. Cl.
*H05K 5/00* (2006.01)

(52) U.S. Cl. .................. 454/184; 361/695; 361/696

(58) Field of Classification Search ............... 454/184, 454/270, 275; 361/695, 696
See application file for complete search history.

(56) References Cited

U.S. PATENT DOCUMENTS

| | | | |
|---|---|---|---|
| 3,691,432 A * | 9/1972 | Edfors et al. ............... 361/687 |
| 4,621,570 A * | 11/1986 | Bolton et al. ............... 454/319 |
| 4,860,163 A * | 8/1989 | Sarath ........................ 361/695 |
| 4,907,645 A * | 3/1990 | Dumas et al. ................ 165/41 |
| 5,119,270 A * | 6/1992 | Bolton et al. ............... 361/687 |
| 5,297,004 A * | 3/1994 | Mazura ....................... 361/690 |
| 5,372,543 A * | 12/1994 | Steele ......................... 454/184 |
| 5,409,419 A * | 4/1995 | Euchner et al. ............. 454/184 |
| 5,414,591 A * | 5/1995 | Kimura et al. .............. 361/695 |
| 5,513,071 A * | 4/1996 | LaViolette et al. .......... 361/703 |
| 5,547,272 A * | 8/1996 | Paterson et al. .......... 312/223.2 |
| 5,642,260 A * | 6/1997 | Sigl .......................... 361/695 |
| 5,725,622 A * | 3/1998 | Whitson et al. ........... 55/385.4 |
| 6,000,769 A * | 12/1999 | Chen ...................... 312/223.2 |
| 6,011,688 A * | 1/2000 | Thornburg et al. ......... 361/695 |
| 6,047,836 A * | 4/2000 | Miles ...................... 211/41.17 |
| 6,115,250 A * | 9/2000 | Schmitt ..................... 361/695 |
| 6,181,557 B1 * | 1/2001 | Gatti ......................... 361/695 |
| 6,229,701 B1 * | 5/2001 | Kung et al. ................ 361/688 |
| 6,400,567 B1 * | 6/2002 | McKeen et al. ............ 361/695 |
| 6,604,799 B2 * | 8/2003 | Searby et al. ............ 312/223.2 |

* cited by examiner

*Primary Examiner*—Derek S. Boles
(74) *Attorney, Agent, or Firm*—Rosenberg, Klein & Lee

(57) ABSTRACT

A louver heat vent for a chassis of a computer, which is mounted in an opening of the chassis, has two shafts and multiple slats. The shafts each have a channel, into which fasteners of the slats can be inserted. The slats are stacked to conceal and shield the interior of the computer chassis yet allow heat to be dissipated quickly.

1 Claim, 5 Drawing Sheets

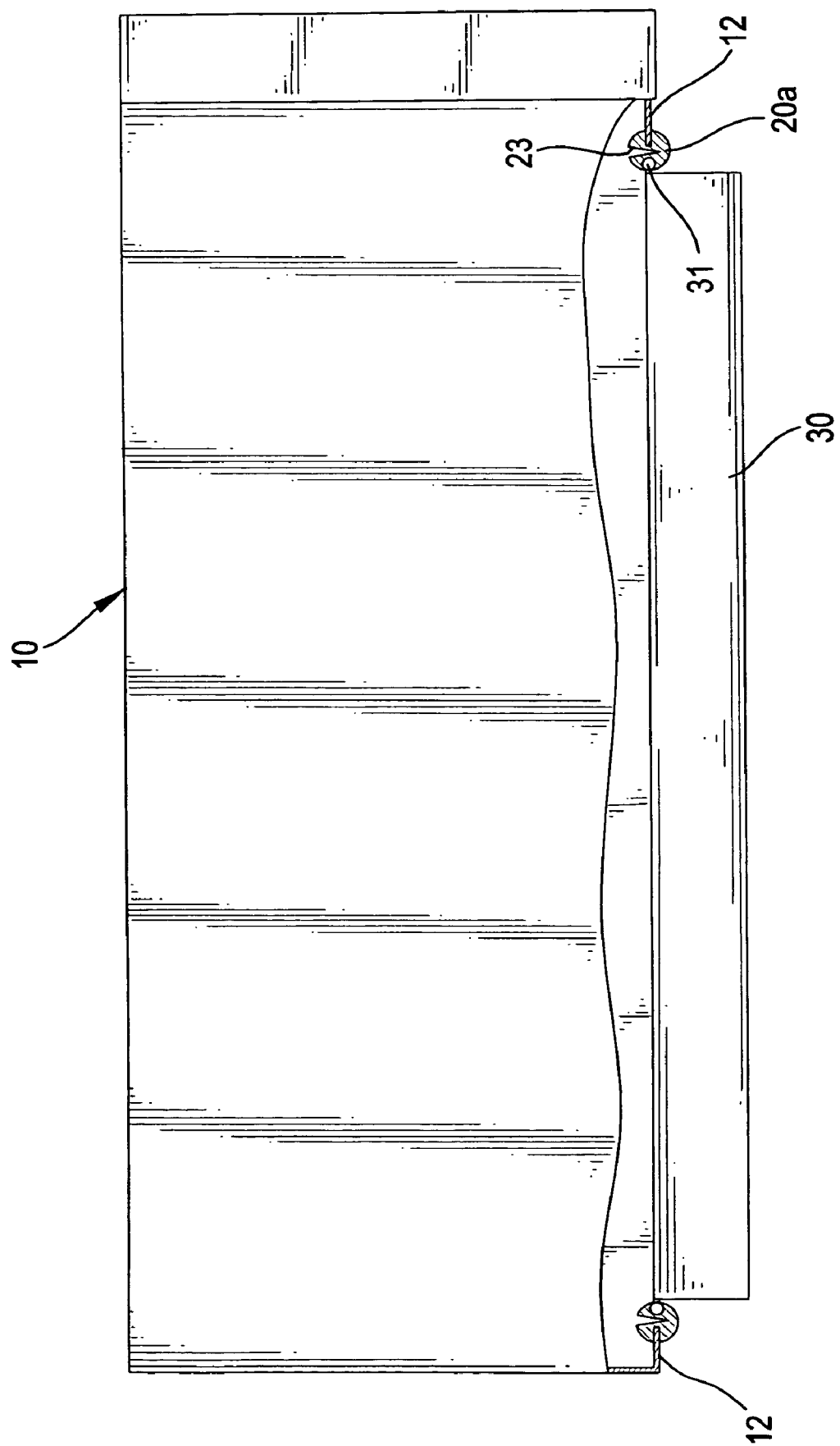

LOUVER HEAT VENT FOR CHASSIS OF COMPUTER

BACKGROUND OF THE INVENTION

1. Field of the Invention

The present invention relates to a heat vent for a chassis of a computer, and more particularly to a louver heat vent, whereby the appearance of the computer is enhanced and an excellent effect of heat dissipation is achieved.

2. Description of Related Art

Multiple holes are respectively defined in a side or a rear end of a chassis of a computer and therefore, heat generated from the operation of the computer can be dissipated via the holes. However, the structural integrity requirements of the chassis limit the sizes of the multiple holes and accordingly, the effectiveness of heat dissipation is restricted. Furthermore, the aesthetic appeal of the computer is impaired due to the multiple holes which can be seen directly.

Therefore, the invention provides a louver heat vent for a chassis of a computer to mitigate or obviate the aforementioned problems.

SUMMARY OF THE INVENTION

The main objective of the present invention is to provide a louver heat vent for a chassis of a computer which can achieve an excellent effect of heat dissipation and slats of which can be combined with different styles.

Other objectives, advantages and novel features of the invention will become more apparent from the following detailed description when taken in conjunction with the accompanying drawings.

BRIEF DESCRIPTION OF THE DRAWINGS

FIG. 5 is a sectional top view of a second preferred embodiment of the louver heat vent for the chassis of the computer in accordance with the present invention.

DETAILED DESCRIPTION OF THE PREFERRED EMBODIMENT

Figure 1:
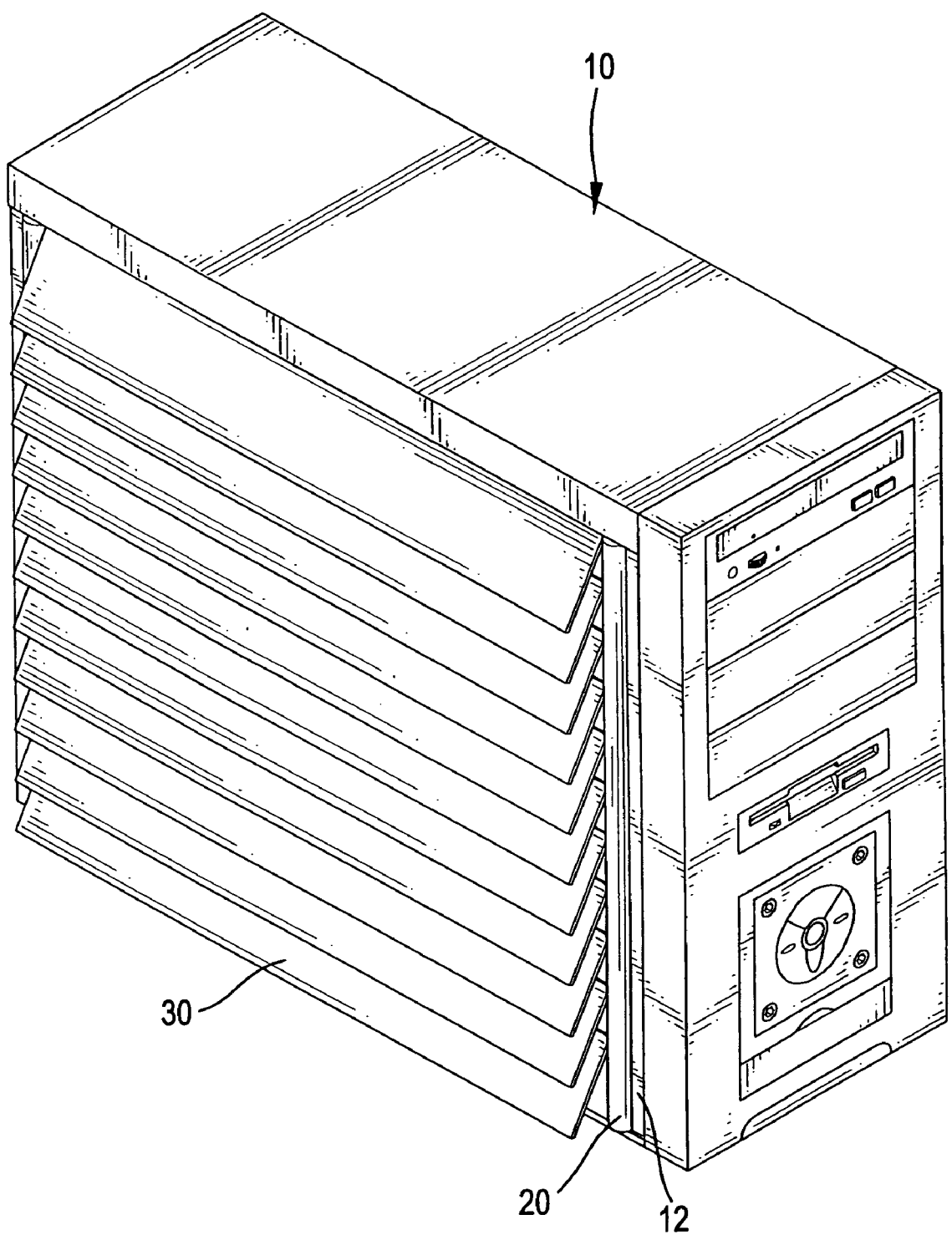
FIG. 1 is a perspective view of a louver heat vent for a chassis of a computer in accordance with the present invention.
Figure 2:
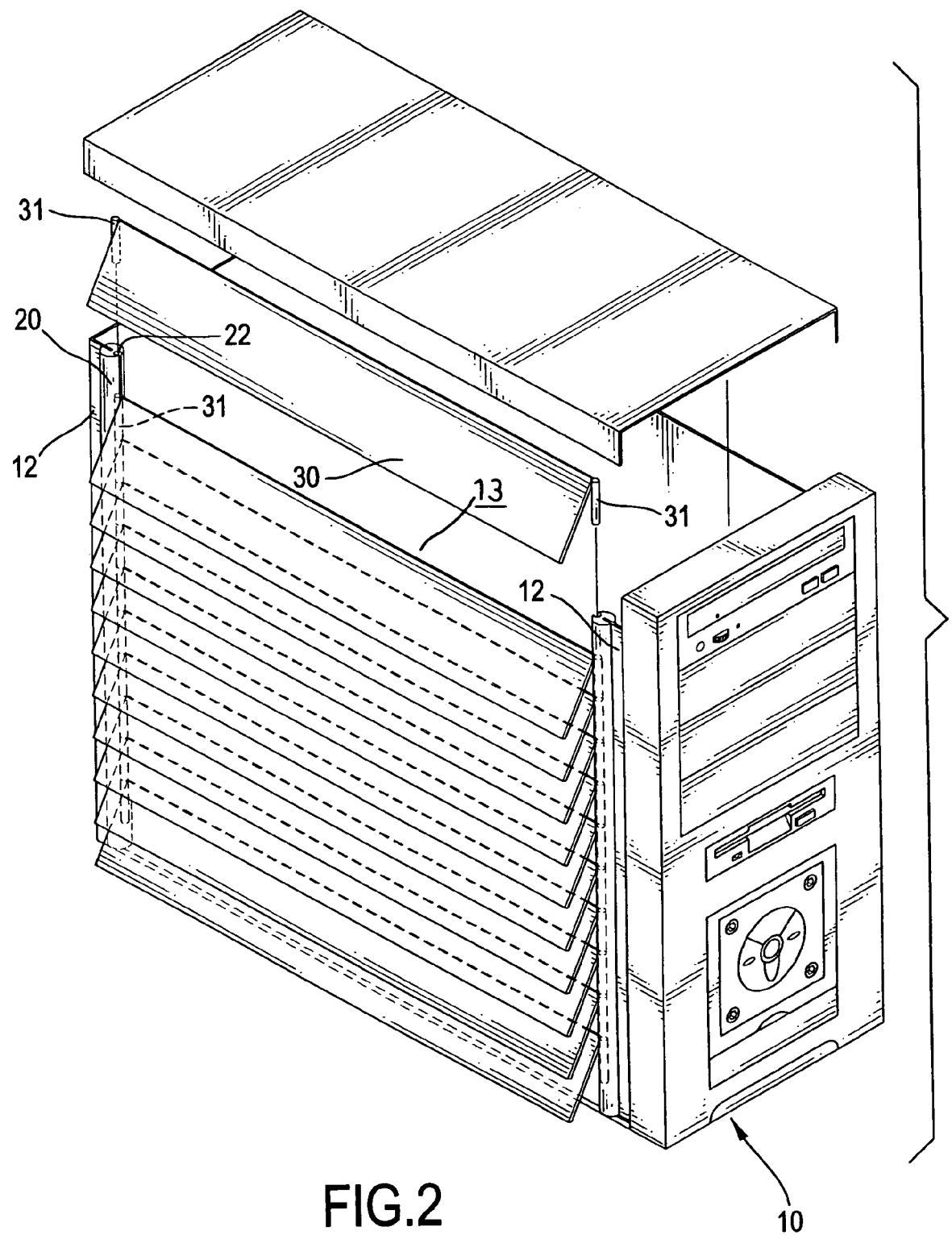
FIG. 2 is an exploded perspective view of the louver heat vent for the chassis of the computer in accordance with present invention.
Figure 3:
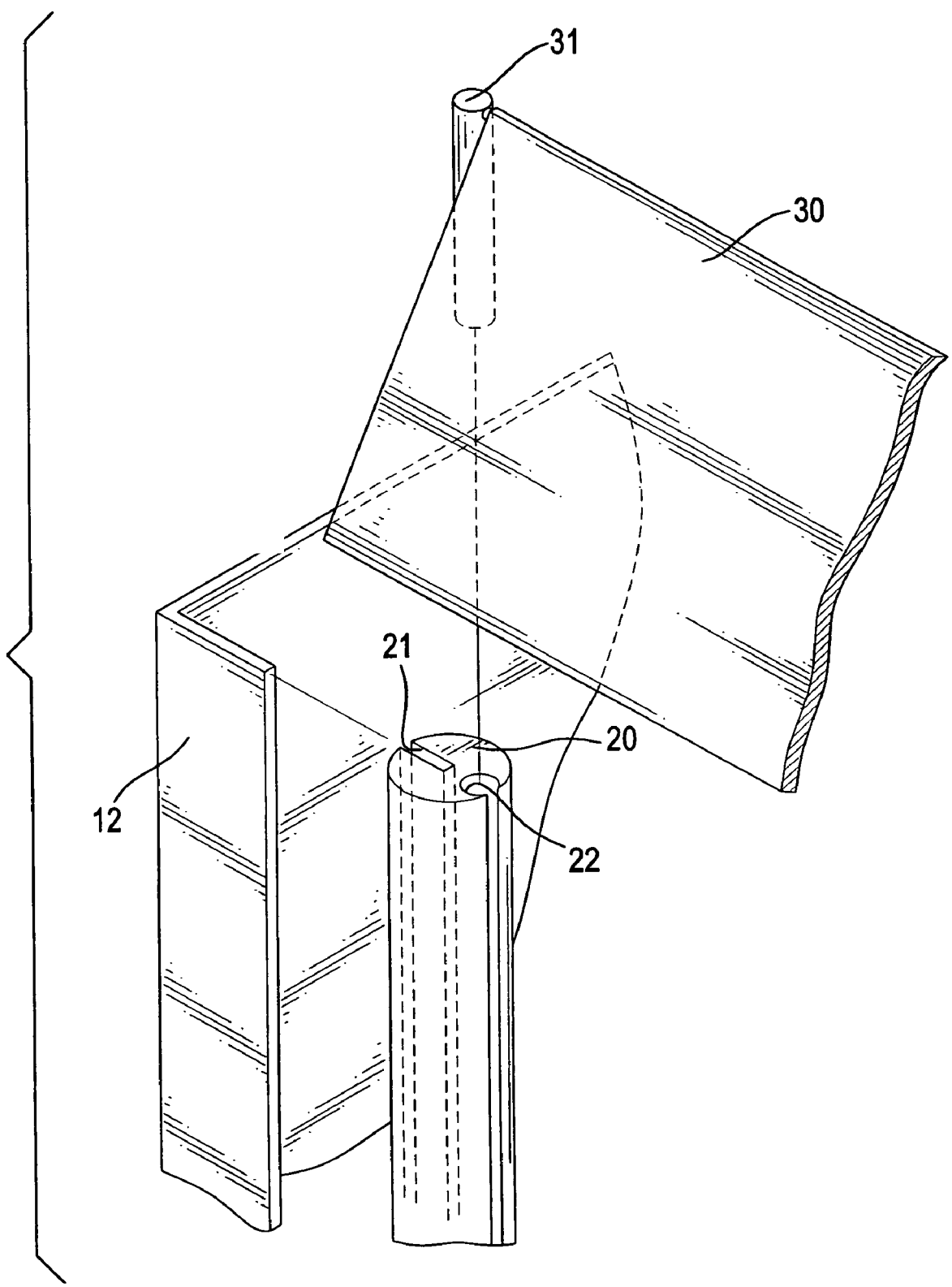
FIG. 3 is an exploded perspective view of a shaft and a slat in accordance with the present invention.
Figure 4:
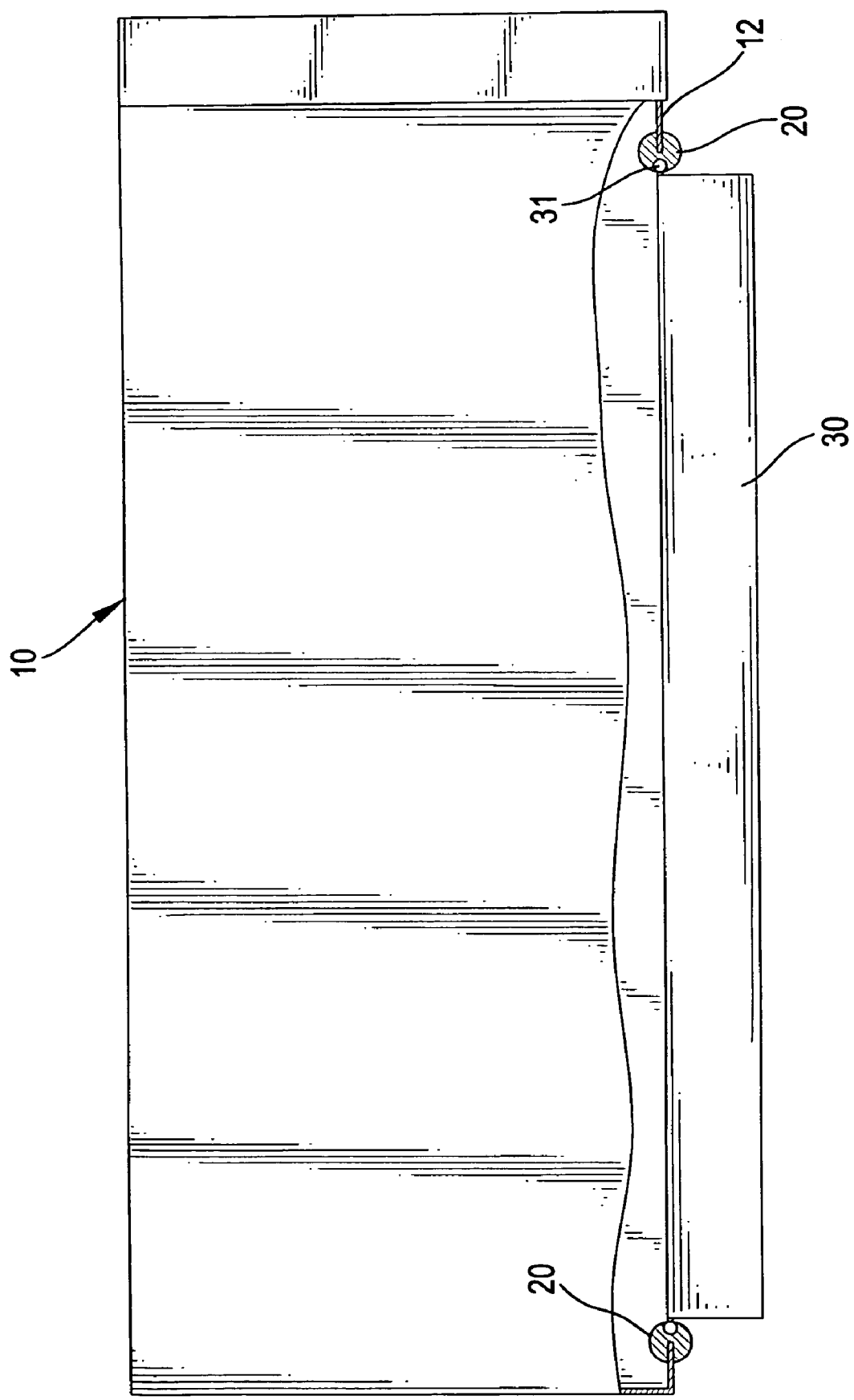
FIG. 4 is a sectional top view of a first preferred embodiment of the louver heat vent for the chassis of the computer in accordance with the present invention.

With reference to FIGS. 1–2, a chassis (10) of a computer comprises a casing (12) with three walls forming a U-like structure when viewed from above, and an opening (13) defined between distal edges of a first and third of the three walls. With reference to FIGS. 2–4, a first preferred embodiment of a louver heat vent for a chassis of a computer, which is provided in the opening (13), has two shafts (20) and multiple slats (30) which are mounted between the two shafts (20). A channel (22) is defined longitudinally along a first side of the shaft (20) and a groove (21) diametrically opposed to the channel (22) and parallel thereto is defined in a second side of the shaft (20). The distal edges defining the opening (13) are mated with the grooves (21) so that the two shafts (20) can be respectively connected to the chassis (10) and there is a space formed between the two shafts (20).

The slats (30) each have a strip and two upright fasteners (31) formed at respective ends of the strip. The strip is inclined downward and outward relative to the upright fasteners (31). In assembly, the slats (30) each can be connected to the chassis (10) due to the corresponding upright fasteners (31) being inserted from a top end of the channel (22) thereby extending into the channel (22) in turn. The slats (30) are stacked to obscure the opening (13). Each upright fastener (31) has a top and a bottom, and except the uppermost and lowermost slats (30) the top and bottoms respectively abut each other. Furthermore, space between each of the slats (30) permits heat from the operation of the chassis (10) to vent from the computer to the external atmosphere.

With reference to FIG. 5, in a second preferred embodiment of the heat sink for the chassis of the computer, two shafts (20a) are provided that are similar to the shafts (20) except that a gap (23) with a V-like cross section is defined between the channel (22) and the groove (21). Thus, a distance between the two shafts (20a) can be decreased via the gaps (23) being expanded due to a pulling force by a user and therefore, the slats (30) can still be connected to the shafts (20a) even if the length of each slat (30) is slightly smaller than the distance between the two shafts (20a). The advantages of the louver heat vent for the chassis of the computer are as follows:

1. The slats (30) partially cover the opening (13) to allow heat to be vented while the unattractive interior of the computer is concealed by an attractive design.

2. Furthermore, the interior components of the computer are shielded by the slats from the invasion of dust, foreign bodies, etc.

3. The slats (30) can be of different colors, patterns and inclinations so that the chassis can be transformed with various styles to achieve aesthetic appeal.

4. The slats (30) can be taken out of the channel (22) directly without tools and therefore, it is easy to maintain the computer.

5. It is easy to assemble the louver heat vent for the chassis (10) of the computer because the shafts (20) are connected to the slats (30) and the chassis (10).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A louver heat vent for a chassis of a computer provided on an opening defined by two opposed distal edges of a casing of the chassis and comprising:

two shafts, each of which has a channel having an arcuate cross section being defined in a longitudinal first side of the shaft and a groove diametrically opposite to and parallel with the channel, each groove being adapted to be mated with a corresponding distal edge of the casing;

a gap with a V-like cross section defined between the channel and the groove in each respective shaft; and multiple slats, each slat having a strip and two upright fasteners formed respectively on opposite ends of the strip, wherein each upright fastener is received in the channel of a respective one of the shafts, whereby the slats are stacked to partly fill the opening of the chassis of the computer.

* * * * *